(12) United States Patent
Baik (10) Patent No.: US 10,916,533 B2
(45) Date of Patent: Feb. 9, 2021

(54) SEMICONDUCTOR PACKAGE

(71) Applicant: SAMSUNG ELECTRONICS CO., LTD., Suwon-si (KR)

(72) Inventor: Seunghyun Baik, Suwon-si (KR)

(73) Assignee: Samsung Electronics Co., Ltd., Suwon-si (KR)

(\*) Notice: Subject to any disclaimer, the term of this patent is extended or adjusted under 35 U.S.C. 154(b) by 0 days.

(21) Appl. No.: 16/248,533

(22) Filed: Jan. 15, 2019

(65) Prior Publication Data
US 2020/0013767 A1    Jan. 9, 2020

(30) Foreign Application Priority Data
Jul. 5, 2018  (KR) .................. 10-2018-0078275

(51) Int. Cl.
*H01L 25/18*    (2006.01)
*H01L 23/00*    (2006.01)
(Continued)

(52) U.S. Cl.
CPC ............ *H01L 25/18* (2013.01); *H01L 23/147* (2013.01); *H01L 23/3128* (2013.01); *H01L 23/49816* (2013.01); *H01L 24/16* (2013.01); *H01L 24/48* (2013.01); *H01L 25/0657* (2013.01); *H01L 25/50* (2013.01); *H01L 21/565* (2013.01); *H01L 24/32* (2013.01); *H01L 24/33* (2013.01); *H01L 24/73* (2013.01); *H01L 24/81* (2013.01); *H01L 2224/16225* (2013.01); *H01L 2224/32145* (2013.01); *H01L 2224/32155* (2013.01); *H01L 2224/33181* (2013.01); *H01L 2224/45124* (2013.01); *H01L 2224/45144* (2013.01); *H01L 2224/48091* (2013.01);
(Continued)

(58) Field of Classification Search
CPC ....... H01L 25/0657; H01L 2224/48227; H01L 24/32; H01L 24/48; H01L 21/565; H01L 25/18; H01L 25/50; H01L 2225/06506; H01L 2225/06586; H01L 2924/1431; H01L 23/49575; H01L 23/49816; H01L 2224/73265; H01L 2225/06568; H01L 23/3128; H01L 2224/81815; H01L 2224/45144; H01L 2224/45124; H01L 2224/48237; H01L 2224/32145; H01L 2924/1434; H01L 2924/00014; H01L 2924/00; H01L 21/50; H01L 24/81; H01L 23/5386; H01L 23/562; H01L 23/16; H01L 23/24

See application file for complete search history.

(56) References Cited

U.S. PATENT DOCUMENTS 7,081,678 B2    7/2006   Liu
8,405,230 B2    3/2013   Lee et al.
(Continued)

FOREIGN PATENT DOCUMENTS

JP    2003258172 A    9/2003
JP    2007165454 A    6/2007

*Primary Examiner* — Jasmine J Clark
(74) *Attorney, Agent, or Firm* — Volentine, Whitt & Francos, PLLC (57) ABSTRACT

A semiconductor package includes a substrate, a first chip on the substrate, a second chip on the substrate and arranged side-by-side with the first chip, and a support structure on the second chip. A width of the support structure is equal to or greater than a width of the second chip.

19 Claims, 10 Drawing Sheets

(51) Int. Cl.
*H01L 25/065* (2006.01)
*H01L 23/31* (2006.01)
*H01L 23/498* (2006.01)
*H01L 25/00* (2006.01)
*H01L 23/14* (2006.01)
*H01L 21/56* (2006.01)

(52) U.S. Cl.
CPC ............... *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2224/81815* (2013.01); *H01L 2225/0651* (2013.01); *H01L 2225/06506* (2013.01); *H01L 2225/06562* (2013.01); *H01L 2225/06586* (2013.01); *H01L 2924/1431* (2013.01); *H01L 2924/1434* (2013.01); *H01L 2924/1436* (2013.01)

(56) References Cited

U.S. PATENT DOCUMENTS

| | | | |
|---|---|---|---|
| 8,674,494 | B2 | 3/2014 | Nam et al. |
| 8,860,215 | B2 | 10/2014 | Miura |
| 9,087,846 | B2 | 7/2015 | Fai et al. |
| 9,673,183 | B2 | 6/2017 | Lim |
| 9,947,644 | B2 * | 4/2018 | Hong ................... H01L 25/0657 |
| 2004/0061213 | A1 | 4/2004 | Karnezos |
| 2006/0267173 | A1 | 11/2006 | Takiar et al. |
| 2009/0166887 | A1 | 7/2009 | Upadhyayula et al. |
| 2011/0175222 | A1 | 7/2011 | Kim et al. |
| 2011/0193243 | A1 | 8/2011 | Gupta et al. |
| 2014/0015148 | A1 | 1/2014 | Lyu |
| 2014/0252640 | A1 | 9/2014 | Kwak |
| 2015/0200187 | A1 | 7/2015 | Park et al. |
| 2016/0148918 | A1 | 5/2016 | Ye et al. |

\* cited by examiner

SEMICONDUCTOR PACKAGE

PRIORITY STATEMENT

This U.S. nonprovisional application claims priority under 35 U.S.C § 119 to Korean Patent Application No. 10-2018-0078275 filed on Jul. 5, 2018 in the Korean Intellectual Property Office, the entire contents of which are hereby incorporated by reference.

BACKGROUND

The present inventive concepts relate to a semiconductor package. more particularly, to a semiconductor package including a semiconductor chip mounted in a flip-chip bonding manner.

A semiconductor package is provided to implement an integrated circuit chip for use in electronic products. Typically, a semiconductor package is configured such that a semiconductor chip is mounted on a printed circuit board (PCB) bonding wires or bumps are used to electrically connect the semiconductor chip to the printed circuit board, and the semiconductor chip is encapsulated in a molded layer. As the electronics industry continues to evolve, it is increasingly required that semiconductor packages have increased capacity, functionality, performance and compactness. Thus, for example, semiconductor packages that have multiple chips mounted on a PCB have been developed.

SUMMARY

According to the present inventive concepts, there is provide a semiconductor package comprising a substrate, at least one first chip on an upper surface of the substrate, a second chip on the upper surface of the substrate and located beside the at least one first chip as viewed in a plan view, and a support structure on the second chip, and in which width of the support structure, in a direction parallel to the upper surface of the substrate, is equal to or greater than a width of the second chip in said direction.

According to the present inventive concepts, there is also provided a semiconductor package comprising a substrate, at least one first chip disposed on and wire-bonded to the substrate, a second chip disposed on the substrate beside the first chip as viewed in a plan view and flip-chip bonded to the substrate, and at least one third chip disposed on as spanning the at least one first chip and the second chip.

According to the present inventive concepts, there is also provided a semiconductor package comprising an electronic package substrate, a first functional block comprising a first chip or a stack of first chips disposed on an upper surface of and electrically connected to the electronic package substrate, a second chip disposed on the upper surface of and electrically connected to the electronic package substrate, a block of silicon-containing material disposed on the second chip and disposed beside the first chip or stack of first chips as viewed in a plan view, and a molded layer on the electronic package substrate and in which the first functional block, the second chip and the block of silicon-containing material are encapsulated. The first functional block has a footprint on a first region of an upper surface of the electronic package substrate. The second chip is disposed beside the first chip or stack of first chips as viewed in a plan view such that the second chip has a footprint on a second region of the substrate beside the first region. A width of the block of silicon-containing material, in a direction parallel to an upper surface of the electronic package substrate, is equal to or greater than a width of the second chip in said direction such that the block of silicon-containing material has a footprint on the second region of the electronic package substrate. Also, the block of silicon-containing material has a silicon content ratio greater than that of the molded layer.

According to the present inventive concepts, there is also provided a semiconductor package comprising an electronic package substrate, a first functional block comprising a first chip or a stack of first chips disposed on an upper surface of and electrically connected to the electronic package substrate, a second chip disposed on the upper surface of and electrically connected to the electronic package substrate, a silicon-based third chip disposed on the second chip and disposed beside the first chip or stack of first chips as viewed in a plan view, and a molded layer on the electronic package substrate and in which the first functional block, the second chip and the silicon based third chip are encapsulated. The first functional block has a footprint on a first region of an upper surface of the electronic package substrate. The second chip is disposed beside the first chip or stack of first chips as viewed in a plan view such that the second chip has a footprint on a second region of the substrate beside the first region. A width of the silicon-based third chip, in a direction parallel to an upper surface of the substrate, is equal to or greater than a width of the second chip in said direction such that the silicon based third chip has a footprint on the second region of the substrate. Also, the silicon-based third chip has a silicon content ratio greater than that of the molded layer.

DETAILED DESCRIPTION

An example of a semiconductor package 1 according to the present inventive concepts will now be described in detail with reference FIG. 1. Note, in the description that follows, a single element or feature such as a chip, terminal or electrical connector may be referred to for simplicity although in practice, and as shown in the drawings, a semiconductor package according to the present inventive concepts may have a plurality of such features or elements.

The semiconductor package 1 may include a substrate 100, a first functional block 200 comprising at least one first chip, a second chip 300, a support structure 400, and a molding layer 900. The substrate 100 is an electronic package substrate having conductive traces, pads, wiring layers or the like integral with a layer(s) of insulating material and may thus be a printed circuit board (PCB). Thus, as shown in the figure, connection pads 112 are provided on a top surface 102 of an insulating body of the substrate 100. The connection pads 112 may include, for example, signal connection pads and/or power/ground connection pads. External pads 114 may be provided on a bottom surface 104 of the insulating body of the substrate 100. External terminals 120 may be provided on the external pads 114. The external terminals 120 may comprise solder bumps or solder balls. The external terminals 120 may be coupled to an external device, which is electrically connected through the external terminals 120 to the substrate 100. The external terminals 120 may include, for example, signal connection terminals and/or power/ground connection terminals.

The first functional block 200 is disposed on the upper surface 102 of the substrate 100. The first functional block 200 may be disposed on one side of the substrate 100. The first functional block 200 may include a single (only one) memory chip. Also, each first chip may include a first pad 212 on a top surface thereof. A first connector 220 may be provided between and coupled to the first chip and the substrate 100 via the pads 112, 212. The first connector 220 may be a bonding wire. The bonding wire may include metal such as gold or aluminum.

Figure 1:
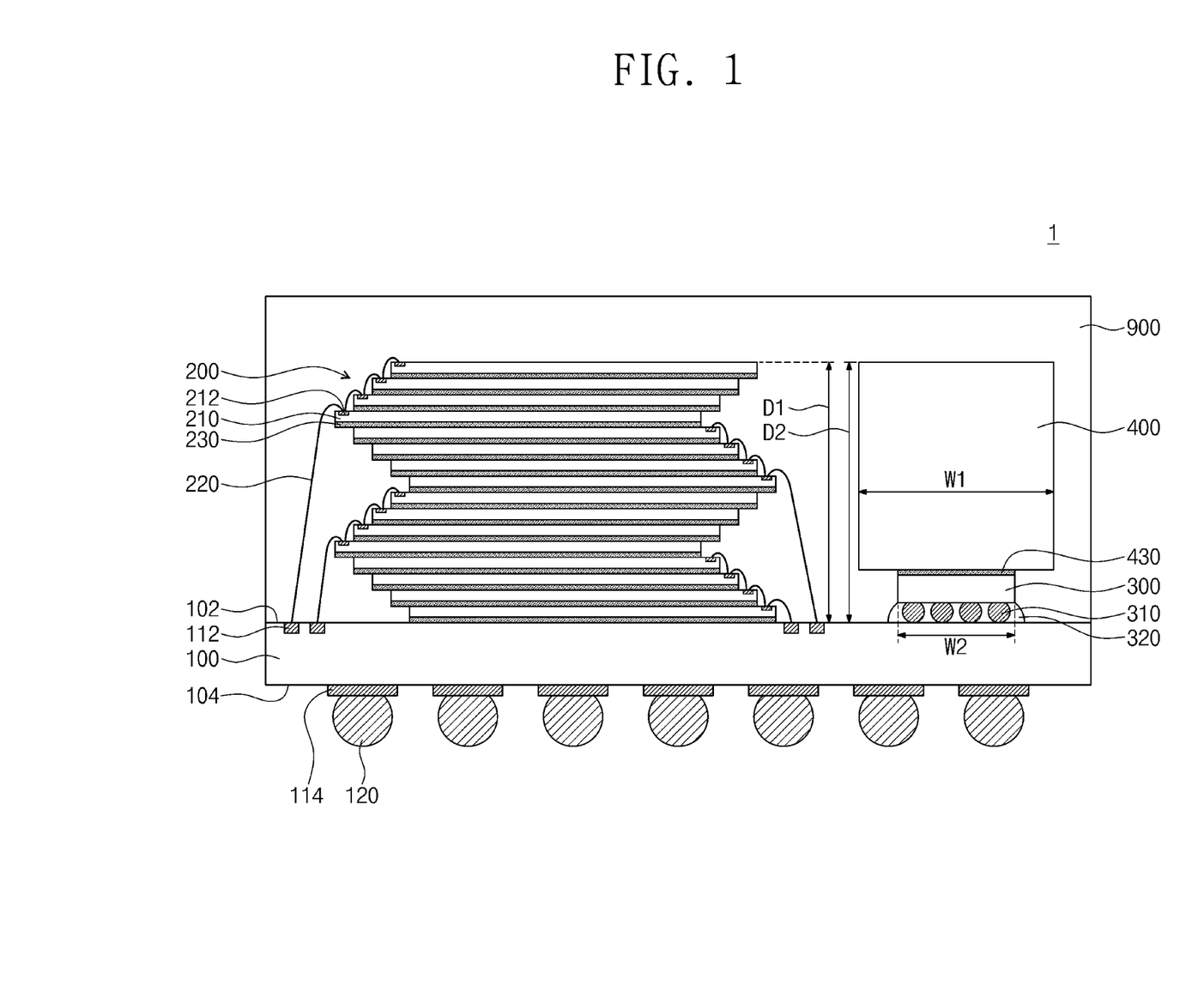
FIG. 1 is a simplified cross-sectional view of an example of a semiconductor package according to the present inventive concepts.

As shown in the example of FIG. 1, instead of just one memory chip, the first functional block 200 may comprise a plurality of memory chips 210 stacked on a first region of the substrate 100 at a side of the substrate 100. Each memory chip 210 may be, for example, a NAND chip. First adhesive layers 230 may be interposed between the memory chips 210 and between the substrate 100 and a lowermost memory chip 210. Each first adhesive layer 230 may be, for example, a die attach film (DAF) or a film over wire (FOW). Also, each of the memory chips 210 may include a first pad 212 on a top surface thereof. The memory chips 210 are laterally offset from each other in the stack so that the first pad 212 of each memory chip 210 is not covered by the memory chip 210 stacked directly thereon. First connectors 220 may be provided between and coupled to the first chips 210 and the substrate 100.

The second chip 300 may be disposed on a second region of the substrate 100 beside the first region over which the first chip or stack of first chips 210 of the first functional block 200 is disposed. The second chip 300 may be disposed on the other side of the substrate 100. The first and second chips may thus be provided side-by-side on the substrate 100. The second chip 300 may be a logic chip. The second chip 300 may be electrically connected to the substrate 100 through a second connection member 310. The second connection member 310 may be a solder bump or a solder ball. For example, the second chip 300 may be flip-chip bonded to the substrate 100. An under-fill layer 320 that protects the second connection member 310 may be provided between the substrate 100 and the second chip 300.

Typically, a logic chip will be smaller than a memory chip at least in terms of its footprint. Therefore, the first functional block 200 will have a footprint on a first region of the substrate 100 greater than the footprint of the second chip 300 on a second region of the substrate 100 when the first functional block 200 is implemented as a single memory chip or stack of memory chips 210 and the second chip 300 is implemented as a logic chip. Because the second chip 300 is mounted in a flip-chip bonding manner, the semiconductor package 1 may have a relative high operating speed and short turnaround time (TAT).

The support structure 400 may be disposed on the second chip 300. The support structure 400 may include silicon (Si). The ratio of silicon to other material (silicon content) of the support structure 400 may be greater than that of the molding layer 900. The support structure 400 may be a block consisting of an insulator comprising silicon. The ratio of silicon (silicon content) means a volume of the Si per a unit volume. In this case, the term "block" may refer to a body of material having a thickness or height that is significantly greater than a width of the body in a direction parallel to the upper surface of the substrate in the figures. Alternatively, the support structure 400 may comprise a dummy chip. As the name implies, the dummy chip, as will be understood by those of ordinary skill in the art, is electrically isolated from all of the other circuitry, i.e., the substrate and chips, in the package, and may be a silicon-based chip.

A second adhesive layer 430 may be interposed between the second chip 300 and the support structure 400. The second adhesive layer 430 may be, for example, a die attach film (DAF) or a film over wire (FOW). The second adhesive layer 430 may have substantially the same thickness as the first adhesive layer 230.

The support structure 400 may have a width W1 equal to or greater than a width W2 of the second chip 300. In this description, the term "width" refers to a dimension in a direction parallel to the upper surface of the substrate 100. A distance D2 from the top surface 102 of the substrate 100 to a top surface of the support structure 400 may be substantially the same as a distance D1 from the top surface 102 of the substrate 100 to a top surface of the first chip 200. In the illustrated example having a stack of first chips, the distance D1 may correspond to a distance from the top surface 102 of the substrate 100 to a top surface of an uppermost chip of the chip stack. In this description, the phrase "substantially" the same size or shape is used to account for possible differences that are inherent or arise due to insignificant errors in the manufacturing process.

The molding layer 900 may be provided on the substrate 100 so as to cover or "encapsulate" the first chip 200, the second chip 300, the support structure 400, and the first connector 220. The molding layer 900 may comprise a dielectric polymer such as an epoxy molding compound.

According to an aspect of the present inventive concepts, the support structure 400 may reduce the effect that a difference in shear stress has on the first chip(s) of the first functional block 200 and the second chip 300. The term "shear stress" refers to the reaction force against deformation by an object caused by engineering characteristics of the object or an external force applied to the object. If the support structure 400 were not provided, the shear stress imposed on the second chip 300 would be remarkably high due to an imbalance in silicon content between the first and second chips, with the result that delamination may occur between the second chip 300 and the molding layer 900. That is, the greater the imbalance in silicon content between a certain chip of the semiconductor package 1 and another chip(s) is/are, the greater the shear stress may become on the certain chip. Because the silicon content of the support structure 400 is greater than that of the molding layer 900, the semiconductor package 1 according to the present inventive concepts may have a relatively high balance of silicon content among the respective chips.

A semiconductor package 2 according to the present inventive concepts will next be described with reference to FIG. 2. In the description of the semiconductor package 2 of FIG. 2, components similar to those of the semiconductor package 1 discussed with reference to FIG. 1 are allocated the same reference numerals, and a detailed description of such components may be omitted in the interest of brevity.

Figure 2:
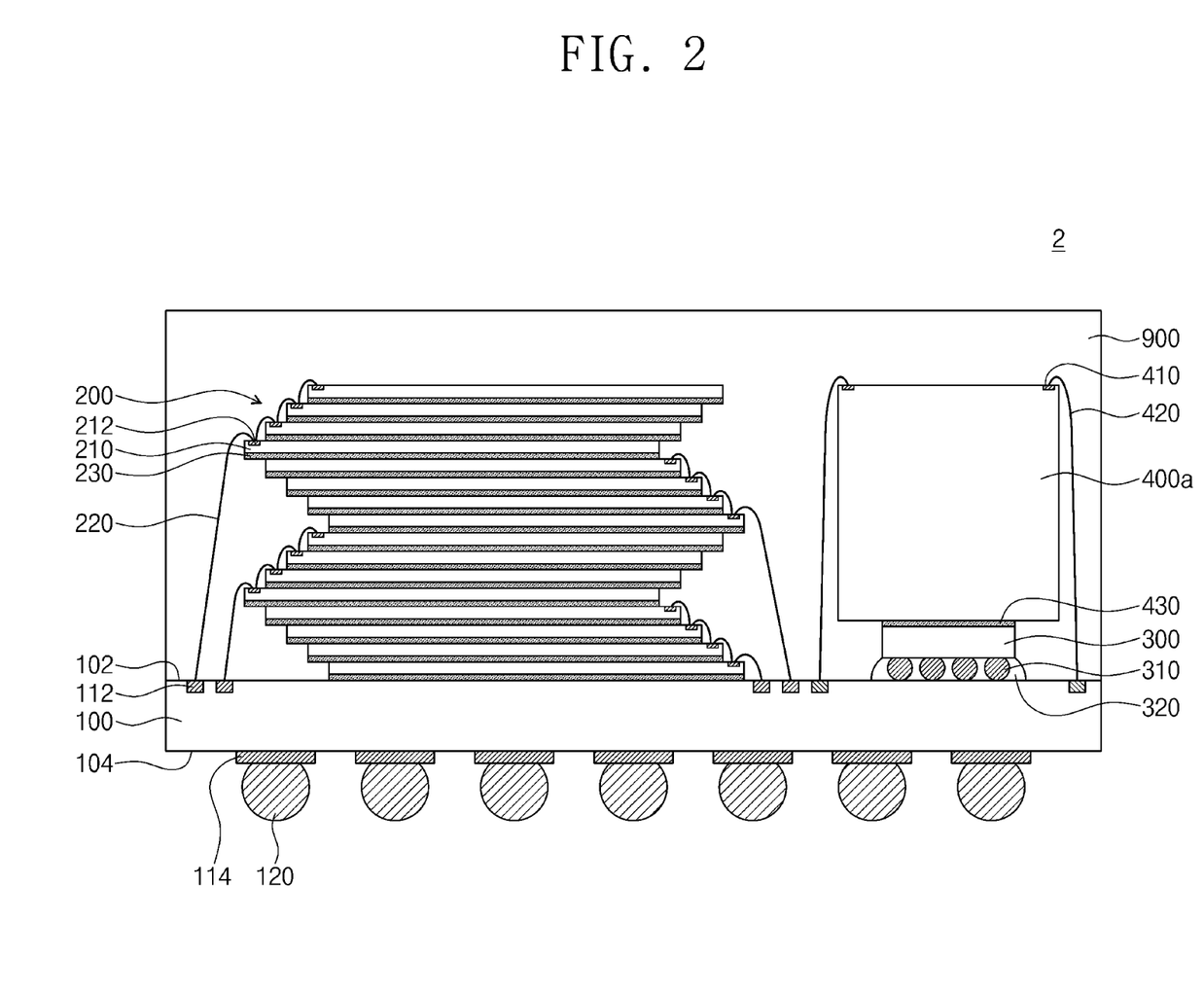
FIG. 2 is a simplified cross-sectional view of another example of a semiconductor package according to the present inventive concepts.

The semiconductor package 2 of FIG. 2 has a support structure 400a provided as a semiconductor chip.

The support structure 400a may be provided as a memory chip. Thus, the support structure 400a may be a NAND chip or a DRAM chip. The silicon content of the support structure 400a provided as a memory chip is greater than that of the molding layer 900. The support structure 400a may include a second pad 410. A second connector 420 may be provided between and coupled to the support structure 400a and the substrate 100. The second connector 420 may be a bonding wire. The bonding wire may comprise a metal such as gold or aluminum.

In this example of the present inventive concepts in which the support structure 400a is provided as a memory chip, it is possible to prevent delamination of the second chip 300 and to increase processing capacity of the semiconductor package 2.

FIGS. 3A to 3D show a method of manufacturing the semiconductor package 1 of FIG. 1.

Figure 3A:
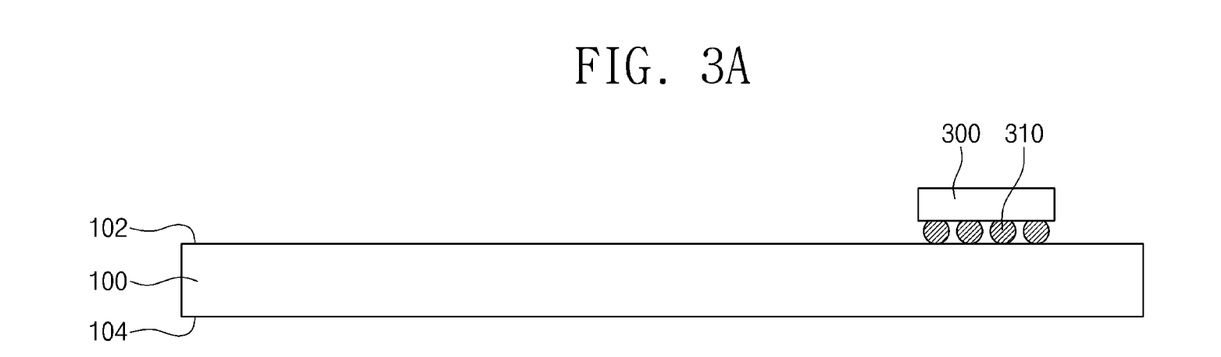
FIGS. 3A, 3B, 3C and 3D are simplified cross-sectional views of a semiconductor package of FIG. 1 during the course of its manufacture and together illustrate an example of a method of manufacturing a semiconductor package according to the present inventive concepts.

Referring to FIGS. 1 and 3A, second chip 300 is placed on substrate 100 with second connection members 310 of the second chip 300 disposed in contact with connection pads (not shown) of the substrate 100. After that, a reflow process may be performed. The reflow process may be performed at a temperature greater than a melting point of the second connection members 310.

Figure 3B:
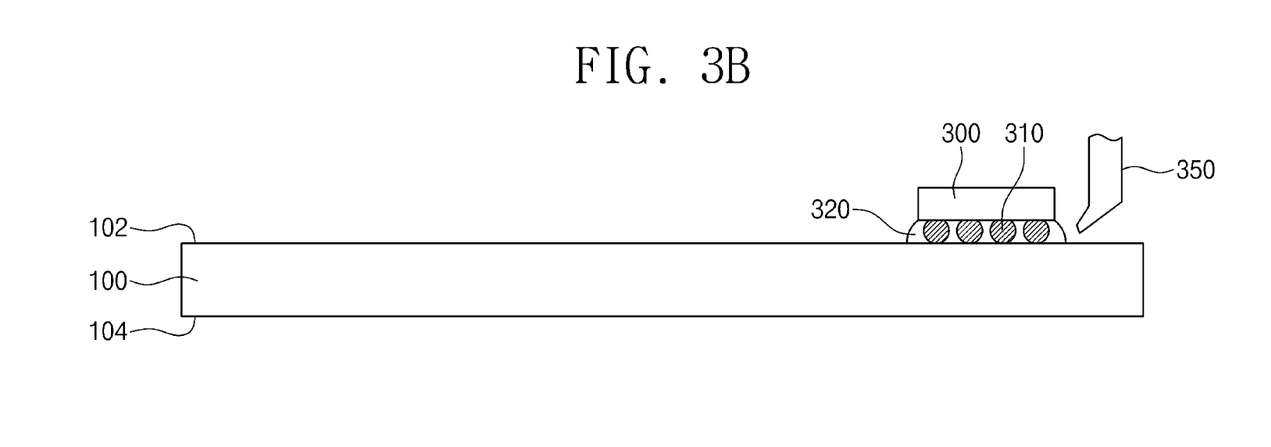

Referring to FIGS. 1 and 3B, an under-fill supplier 350 may provide an under-fill material around the second connection members 310 of the second chip 300, and a curing process may be performed. As a result, the second chip 300 is flip-chip bonded to the substrate 100.

Figure 3C:
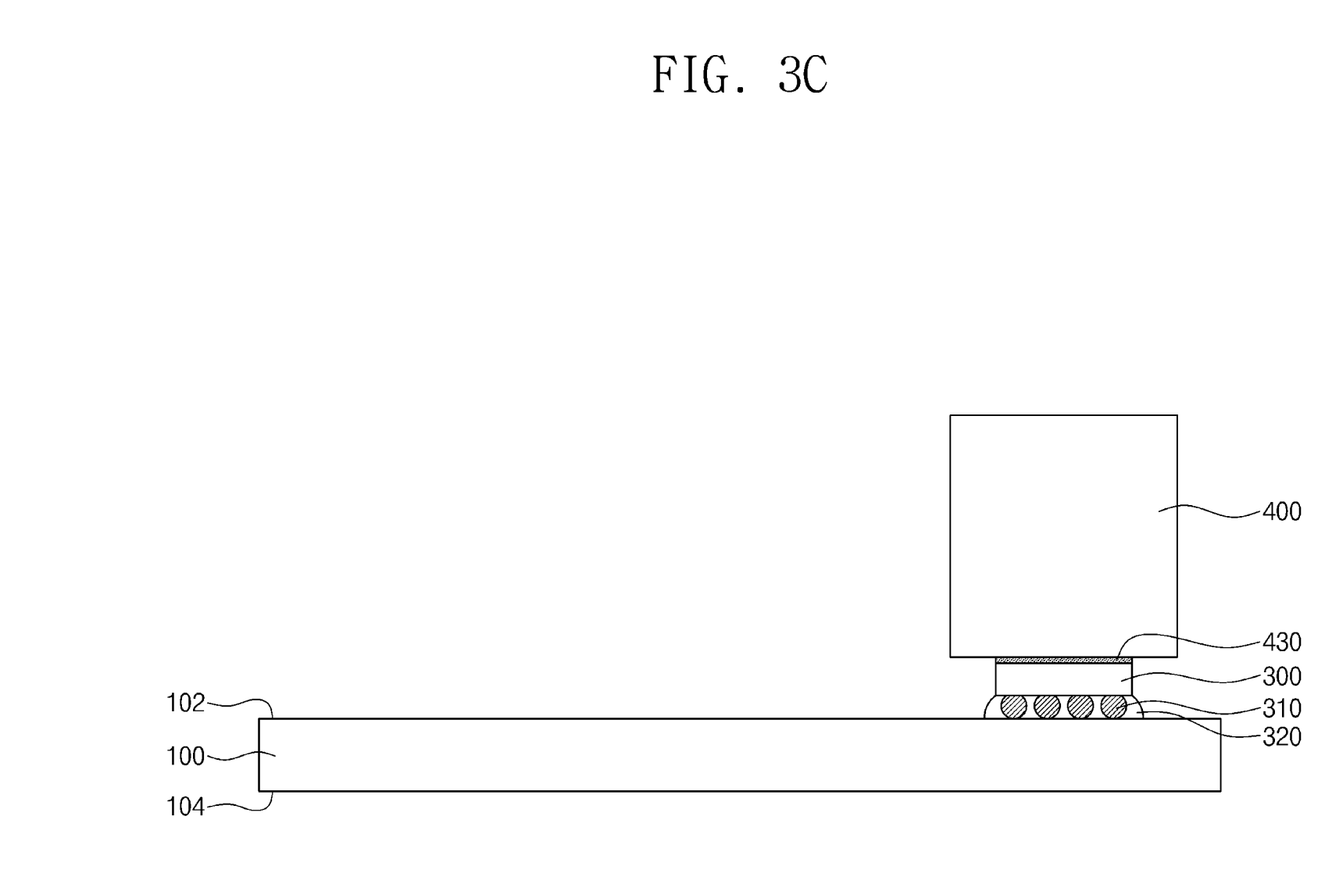

Referring to FIGS. 1 and 3C, support structure 400 is mounted on the second chip 300. For example, a second adhesive layer 430 is provided on the second chip 300 and the support structure 400 is provided on the second adhesive layer 430. Alternatively, the second adhesive layer 430 may be provided on a bottom surface of the support structure and then the support structure 400 with the second adhesive layer 430 is pressed onto a top surface of the second chip 300. Note, the second chip 300 is more vulnerable to stress applied by the support structure 400 when the second chip 300 is mounted to the substrate 100 in a flip-chip bonding manner than if the same chip were wire bonded to the substrate. Accordingly, a small pressure and a long process time may be required when the support structure 400 is bonded to the second chip 300 to prevent the chip 300 from being damaged.

Figure 3D:
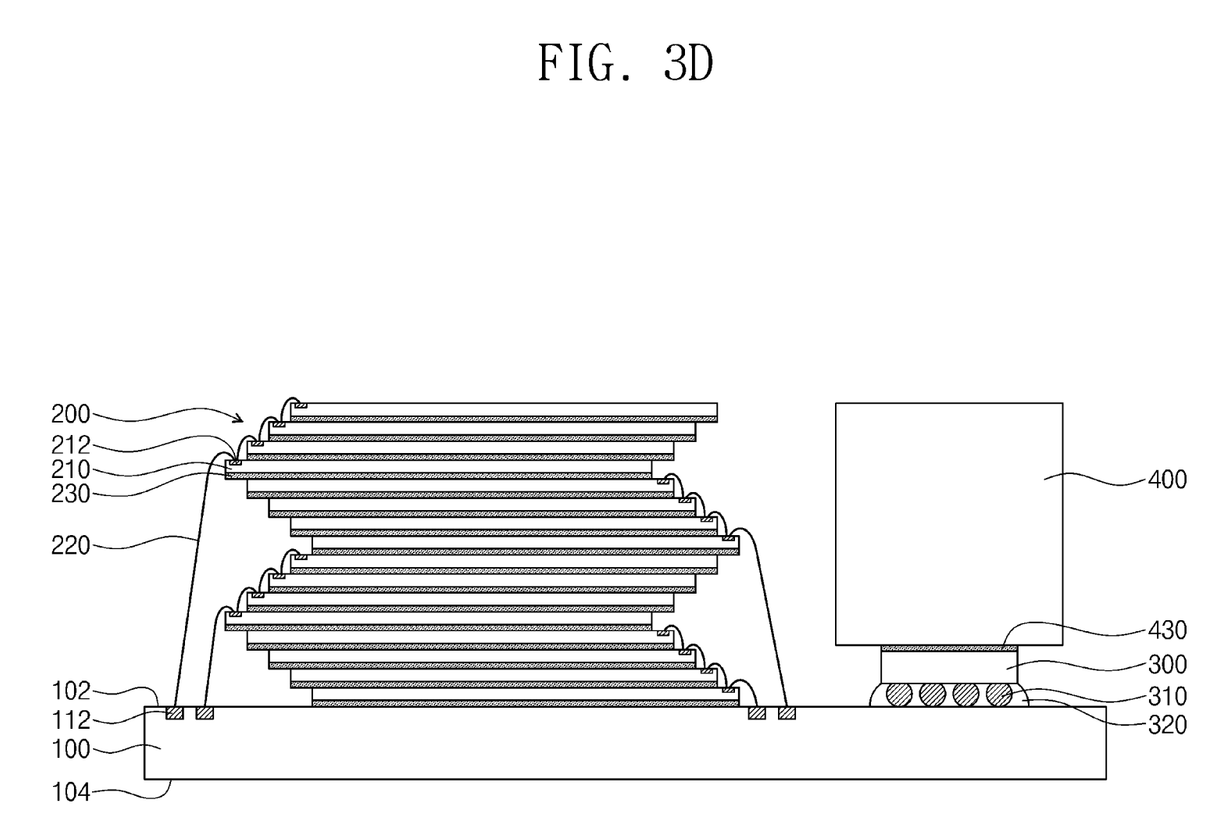

Referring to FIGS. 1 and 3D, the first functional block 200 may be formed beside the second chip 300 on the substrate 100. In this process, the first chip(s) of the first functional block may be wire-bonded to the substrate 100. A molding layer 900 may be formed to cover the first chip 200, the second chip 300, and the support structure 400, and an external terminal 120 may be attached to a bottom surface 104 of the substrate 100, which procedures may complete the manufacturing of the semiconductor package 1 of FIG. 1.

Next, an example of a semiconductor package 3 according to the present inventive concepts will be described in detail with reference to FIG. 3. In the description of the semiconductor package 3 of FIG. 4, components similar to those of the semiconductor package 1 discussed with reference to FIG. 1 are allocated the same reference numerals, and a detailed description thereof may be omitted in the interest of brevity.

Figure 4:
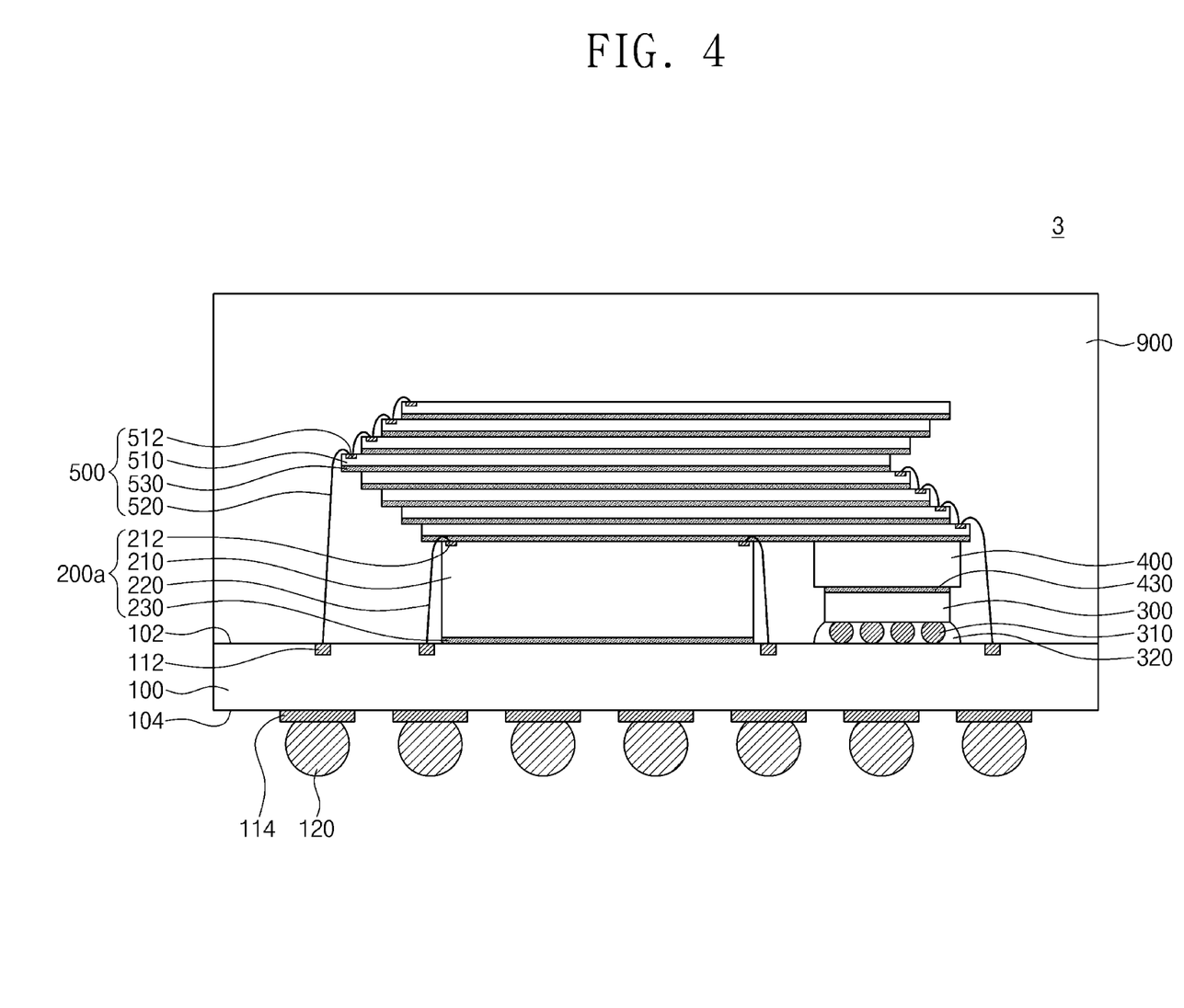
FIG. 4 is a simplified cross-sectional view of another example of a semiconductor package according to the present inventive concepts.

The semiconductor package 3 of FIG. 4 includes a second functional block 500 comprising at least one third chip. In this example, the first functional block is a single memory chip 200a. The third functional block 500 may also be a single memory chip. The third functional block 500 may comprise, for example, a NAND chip or a DRAM chip. The third functional block 500 is provided on the first chip 200a and the support structure 400.

In the example of the semiconductor package 3 illustrated in FIG. 4 instead of single third chip, the second functional block 500 comprises a plurality of stacked memory chips 510 provided on the first chip 200a and the support structure 400. Third adhesive layers 530 may be interposed between the stacked memory chips 510. The third adhesive layer 530 may be, for example, a die attach film (DAF) or a film over wire (FOW). A third adhesive layer 530 may also be interposed between a lowermost memory chip 510, the first chip 200a, and the support structure 400.

Each of the memory chips 510 may include a third pad 512 on a top surface thereof. A third connector 520 may be provided between and coupled to the third chip 500 and the substrate 100. The third connector 520 may be a bonding wire. The bonding wire may include metal, such as gold or aluminum.

An example of a semiconductor package 4 according to the present inventive concepts will now be described in detail with reference to FIG. 5. In the description of the semiconductor package 4 of FIG. 5, components similar to those of the semiconductor package 3 discussed with reference to FIG. 4 are allocated the same reference numerals, and a detailed description thereof may be omitted in the interest of brevity.

Figure 5:
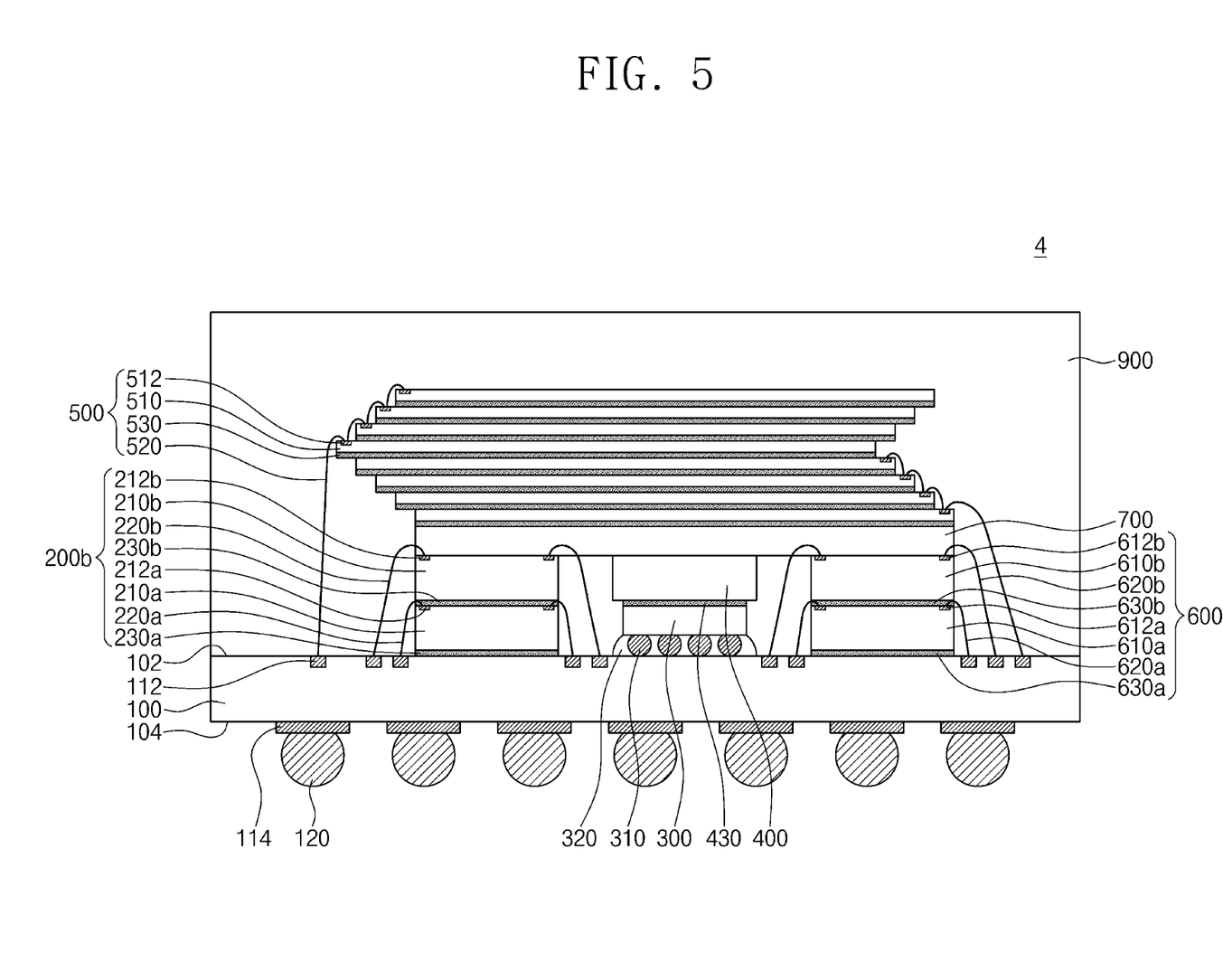
FIG. 5 is a simplified cross-sectional view of still another example of a semiconductor package according to the present inventive concepts.

The semiconductor package 4 of FIG. 5 includes a first functional block 200b, second functional block 500, third functional block 600 and a first spacer 700.

The third functional block 600 may be arranged on the upper surface 102 of the substrate 100 side-by-side with first functional block 200b and second chip 300. For example, the second chip 300 may be disposed between the first functional block 200b and third functional block 600.

The first functional block 200b may be a chip stack comprising a plurality of stacked chips. For example, the first functional block 200b may include a first lower memory chip 210a and a first upper memory chip 210b stacked on the first lower memory chip 210a. Each of the first lower and upper memory chips 210a and 210b may include a single DRAM chip, but the present inventive concepts are not limited thereto. First adhesive layers 230a and 230b may be interposed between the first lower memory chip 210a and the substrate 100 and between the first lower and upper memory chips 210a and 210b, respectively. Each of the first adhesive layers 230a and 230b may be, for example, a die attach film (DAF) or a film over wire (FOW). The first lower and upper memory chips 210a and 210b may include their first pads 212a and 212b on top surfaces thereof. First connectors 220a and 220b may be provided between and coupled to the first chip 200b and the substrate 100. The first connectors 220a and 220b may be bonding wires.

The third functional block 600 may have a single (only one) memory chip. Alternatively, the fourth functional block 600 may be a chip stack comprising a plurality of stacked chips. For example, the fourth functional block 600 may include a fourth lower memory chip 610a and a fourth upper memory chip 610b stacked on the fourth lower memory chip 610a. Each of the fourth lower and upper memory chips 610a and 610b, i.e., each of the fourth chips of the chip stack, may be a DRAM chip, but the present inventive concepts are not limited thereto. Fourth adhesive layers 630a and 630b may be interposed between the fourth lower memory chip 610a and the substrate 100 and between the fourth lower and upper memory chips 610a and 610b, respectively. Each of the fourth adhesive layers 630a and 630b may be, for example, a die attach film (DAF) or a film over wire (FOW). The fourth lower and upper memory chips 610a and 610b may include fourth pads 612a and 612b on top surfaces thereof, respectively. Fourth connectors 620a and 620b may be provided between and coupled to the fourth chip 600 and the substrate 100. The fourth connectors 620a and 620b may be bonding wires.

The first spacer 700 may be provided between the first functional block 200b, the second chip 300, the third functional block 600, collectively, and the second functional block 500. Even more specifically, the first spacer 700 may be provided between the first functional block 200b, the support structure 400, the third functional block 600, collectively, and the second functional block 500. The first spacer 700 may be provided on the first functional block 200b, the third functional block 600, and the support structure 400. The first spacer 700 is a plate of an insulator, i.e., may have a thickness or height that is substantially less that its other two dimensions (those in directions parallel to an upper surface of the substrate) and may include silicon (Si) but the present inventive concepts are not limited thereto. The first spacer 700 may have a size (footprint) corresponding to that of the chip(s) of the functional block 500, but the present inventive concepts are not limited thereto.

According to an aspect of this example of the present inventive concepts, the first spacer may serve as a support structure. Thus, the first spacer 700 may enhance the structural stability of the semiconductor package 4. In particular, the first spacer 700 may prevent the semiconductor package 4 from warping at an upper portion thereof in the region of the chips of functional block 500 and/or from voids forming due to the warpage. As a result, the semiconductor package 4 may be relatively defect-free.

A die attach film (DAF) or A film over wire (FOW) can be provided between the first spacer 700 and the first functional block 200b, the support structure 400, and third functional block 600, but it can be omitted for briefy of drawings.

Figure 6:
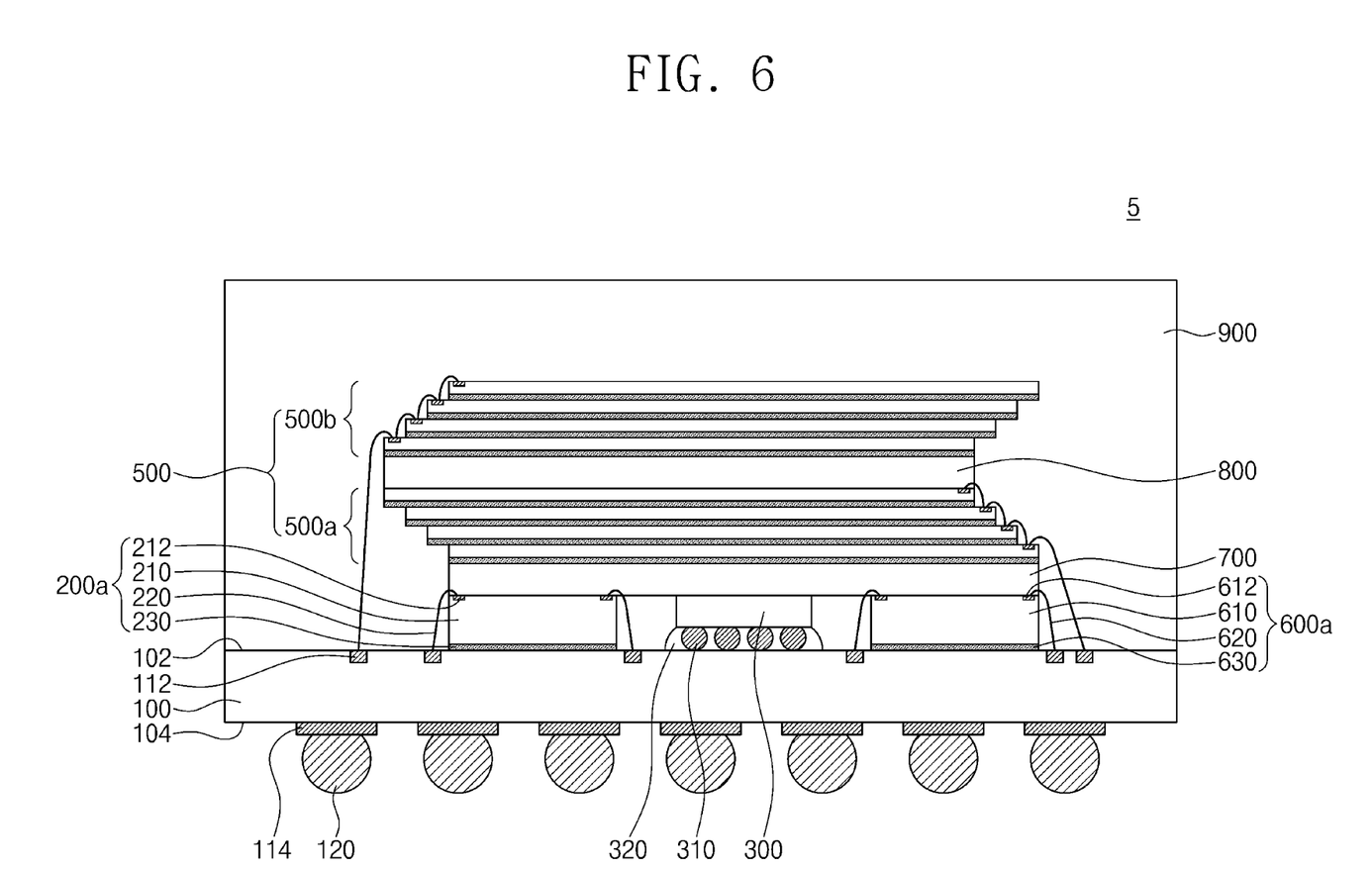
FIG. 6 is a simplified cross-sectional view of still another example of a semiconductor package according to the present inventive concepts.

A semiconductor package 5 according to the present inventive concepts will now be described with reference to FIG. 6. In FIG. 6, components similar to those of the semiconductor packages 3 and 4 discussed with reference to FIGS. 4 and 5, respectively, are allocated the same reference numerals, and a detailed description thereof may be omitted in the interest of brevity.

The semiconductor package 5 of FIG. 6 may include a second spacer 800. A third functional block 600a may have a single (only one) memory chip.

The semiconductor package 5 of FIG. 6 may include a first chip stack 500a and a second chip stack 500b stacked on the first chip stack 500a. Each of the first and second chip stacks 500a and 500b may include a plurality of stacked memory chips, as discussed above. Therefore, a detailed description thereof will be omitted.

The second spacer 800 may be provided between the first and second chip stacks 500a and 500b. The second spacer 800 may consist of an insulator in the form of a plate including silicon (Si), but the present inventive concepts are not limited thereto. The second spacer 800 may have a size (footprint) corresponding to that of one of the chips of the functional block 500, but the present inventive concepts are not limited thereto.

According to an aspect of this example of the present inventive concepts, the second spacer 800 may impart a structural stability to the semiconductor package 5. The second spacer 800 may be provided to prevent the semiconductor package 5 from warping at an upper portion of the region containing the chips of functional block 500 and/or may prevent voids from forming due to the warpage.

A die attach film (DAF) or A film over wire (FOW) can be provided between the first spacer 700 and the first functional block 200a, the second chip 300, and third functional block 600a, but it can be omitted for briefy of drawings.

A semiconductor package 6 according to the present inventive concepts will now be described in detail with reference to FIG. 7. In the semiconductor package 6 of FIG. 7, components similar to those of the semiconductor package 3 discussed with reference to FIG. 4 are allocated the same reference numerals, and a description thereof may be omitted in the interest of brevity.

Figure 7:
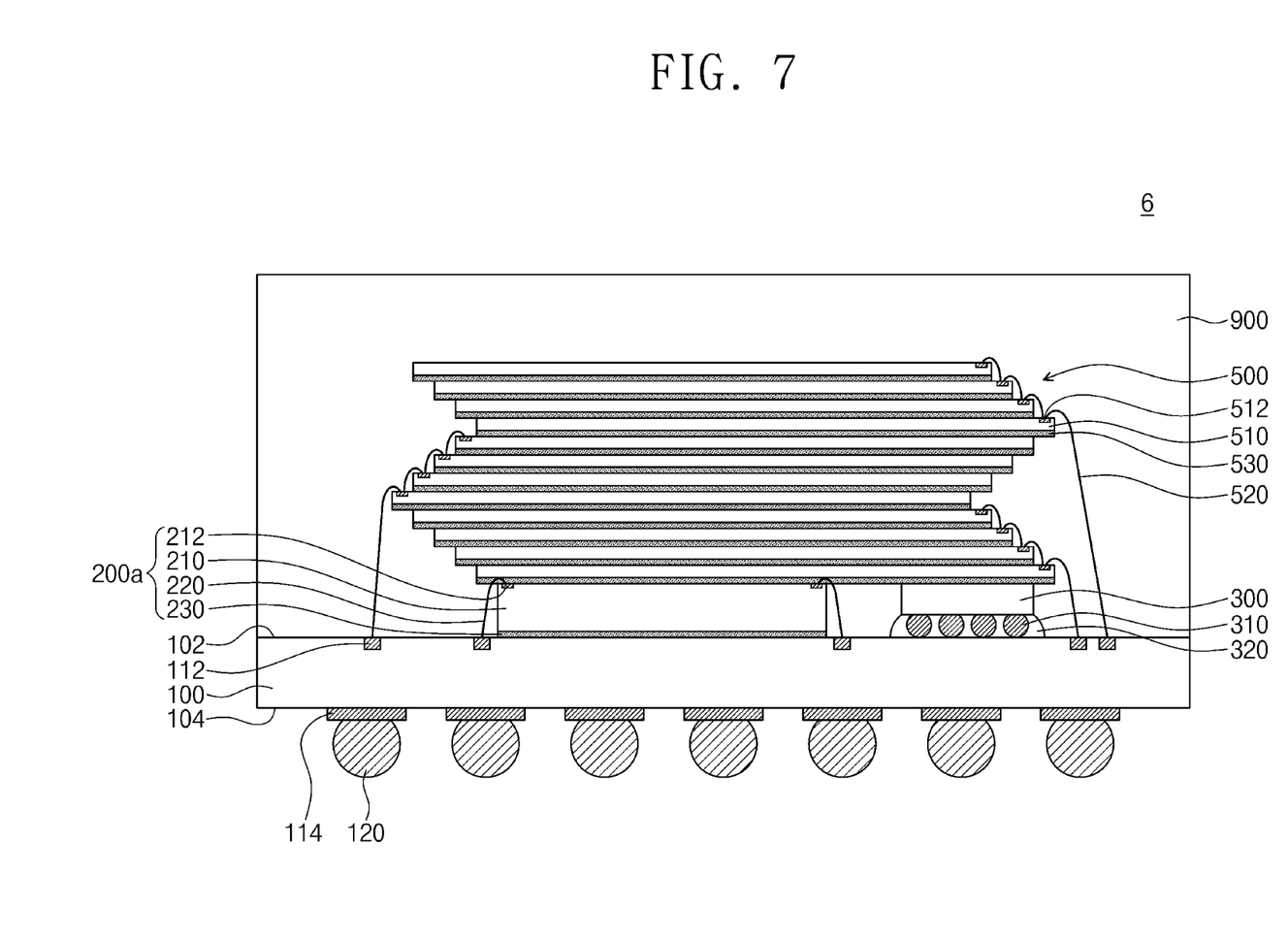
FIG. 7 is a simplified cross-sectional view of still another example of a semiconductor package according to the present inventive concepts.

The semiconductor package 6 of FIG. 7 has no support structure.

Because the second chip 300 is mounted in the flip-chip bonding manner, the semiconductor package 6 can operate at a high speed with a short turnaround time (TAT), while still possessing a high degree of integration.

A semiconductor package 7 according to the present inventive concepts will now be described with reference to FIG. 8. In the semiconductor package 7 of FIG. 8, components similar to those of the semiconductor package 6 discussed with reference to FIG. 7 are allocated the same reference numerals, and a description thereof may be omitted in the interest of brevity.

Figure 8:
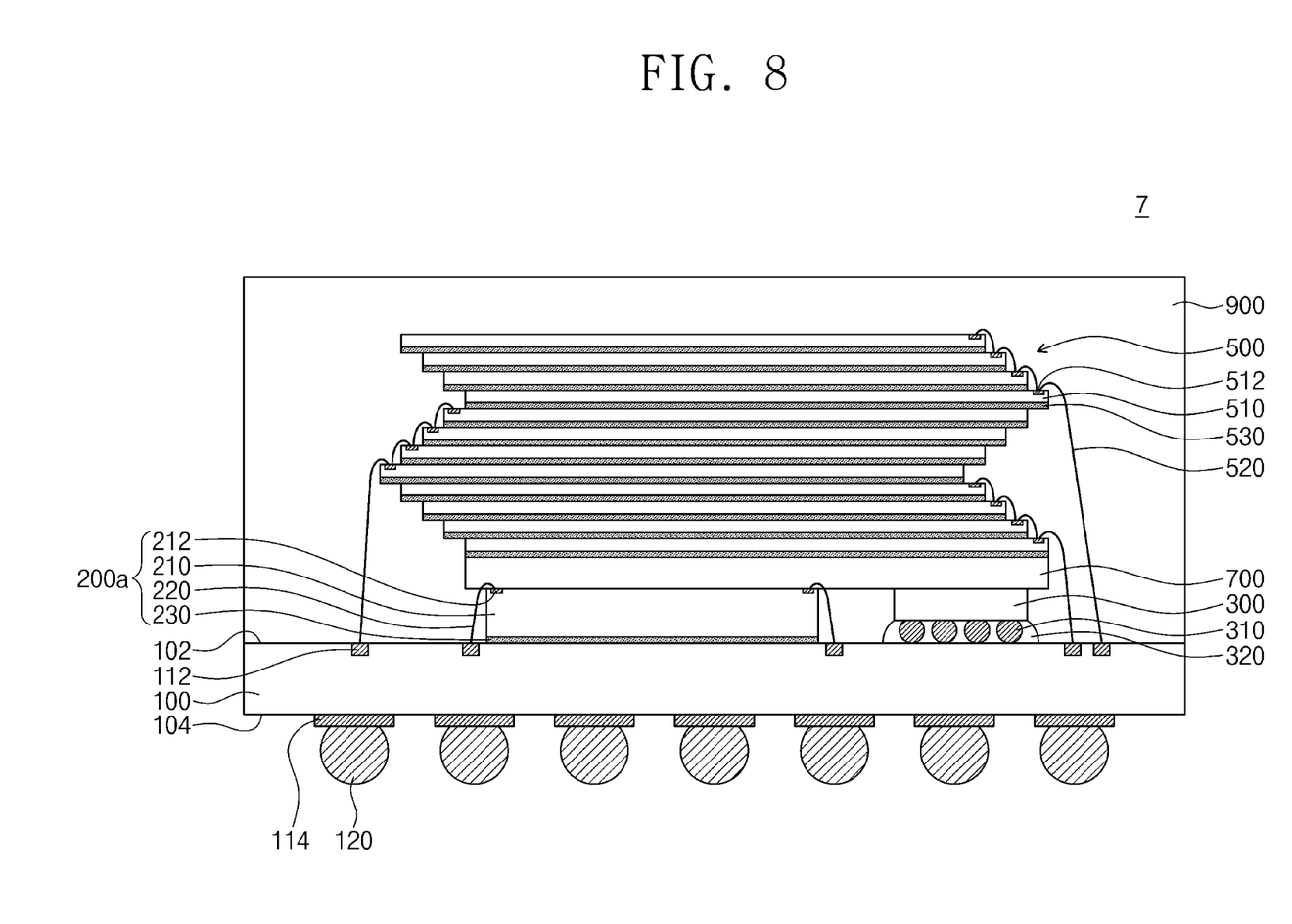
FIG. 8 is a simplified cross-sectional view of still another example of a semiconductor package according to the present inventive concepts.

The semiconductor package 7 of FIG. 8 includes a first spacer 700.

The first spacer 700 may be provided between the first chip 220 and the second chip 300, collectively, and the functional block 500. The first spacer 700 may be a plate of an insulator and may include silicon (Si). The first spacer 700 may have a size (footprint) corresponding to that of a chip of functional block 500, but the present inventive concepts are not limited thereto.

According to an aspect of this example of the present inventive concepts, the first spacer 700 may impart structural stability to the semiconductor package 7. In particular, the first spacer 700 may be provided to prevent the semiconductor package 7 from warping at an upper portion of the region containing the chips of functional block 500 and/or may prevent voids from forming due to the warpage. As a result, the semiconductor package 7 may be relatively defect-free.

According to some examples of the present inventive concepts, semiconductor packages are provided that have high degrees of integration and are structurally stable.

A die attach film (DAF) or A film over wire (FOW) can be provided between the first spacer 700 and the first functional block 200a and the second chip 300, but it can be omitted for briefy of drawings.

Also, according to some examples of the present inventive concepts, semiconductor packages are provided in which a molding layer and a chip mounted on a substrate are prevented from delaminating from one another.

However, the effects, benefits and advantages of the present inventive concepts are not limited to those described above. Other effects, benefits and advantages which are not mentioned above, will be apparent to those skilled in the art from the foregoing description and accompanying drawings.

Finally, the examples of the present inventive concepts described herein are presented to facilitate an understanding of the present inventive concepts and should not be construed as limiting the scope of the present inventive concepts. Rather, various combinations, modifications, and variations of the examples described herein are seen to fall within the true spirit and scope of the inventive concepts as defined by the appended claims.

What is claimed is:

1. A semiconductor package, comprising:
    a substrate;
    at least one first chip on an upper surface of the substrate;
    a second chip on the upper surface of the substrate and located beside the at least one first chip as viewed in a plan view; and
    a support structure on the second chip,
    wherein a width of the support structure, in a direction parallel to the upper surface of the substrate, is equal to or greater than a width of the second chip in said direction, and
    wherein a distance from the upper surface of the substrate to a top surface of the support structure is substantially the same as a distance from the upper surface of the substrate to a top surface of an uppermost one the at least one first chip.

2. The semiconductor package of claim 1, wherein the support structure comprises a block of insulating material, a dummy chip, or a memory chip.

3. The semiconductor package of claim 1, wherein the support structure comprises silicon (Si).

4. The semiconductor package of claim 1, wherein each said at least one first chip is a memory chip, and
    the second chip is a logic chip.

5. The semiconductor package of claim 1, wherein the at least one first chip is wire-bonded to the substrate, and
    the second chip is flip-chip bonded to the substrate.

6. The semiconductor package of claim 4, wherein the at least one first chip is a chip stack.

7. The semiconductor package of claim 1, further comprising at least one third chip on the at least one first chip and the second chip.

8. The semiconductor package of claim 1, further comprising at least one third chip on the at least one first chip and the support structure.

9. The semiconductor package of claim 7, further comprising a first spacer interposed between the at least one first chip and the at least one third chip.

10. The semiconductor package of claim 9, further comprising at least one fourth chip on the upper surface of the substrate and disposed beside the at least one first chip and the second chip as viewed in a plan view, the at least one fourth chip being interposed between substrate and the first spacer.

11. A semiconductor package, comprising:
    an electronic package substrate;
    a first functional block comprising at least one first chip disposed on an upper surface of and electrically connected to the electronic package substrate, the first functional block having a footprint on a first region of an upper surface of the electronic package substrate;
    a second chip disposed on the upper surface of and electrically connected to the electronic package substrate, the second chip being disposed beside the at least one first chip as viewed in a plan view such that the second chip has a footprint on a second region of the electronic package substrate beside the first region;
    a block of silicon-containing material disposed on the second chip and disposed beside the at least one first chip as viewed in a plan view; and
    a molded layer on the electronic package substrate and in which the first functional block, the second chip and the block of silicon-containing material are encapsulated,
    wherein a width of the block of silicon-containing material, in a direction parallel to an upper surface of the electronic package substrate, is equal to or greater than a width of the second chip in said direction such that the block of silicon-containing material has a footprint on the second region of the electronic package substrate, and
    the block of silicon-containing material has a silicon content ratio greater than that of the molded layer.

12. The semiconductor package of claim 11, wherein the at least one first chip is a memory chip stack, the second chip is a logic chip, and a top surface of the block of silicon-containing material and a top surface an uppermost memory chip of the memory chip stack are situated at substantially the same distance above the upper surface of the electronic package substrate.

13. The semiconductor package of claim 11, wherein the first functional block consists of a single first chip, and a top surface of the block of silicon-containing material and a top surface the single first chip are situated at substantially the same distance above the upper surface of the electronic package substrate.

14. The semiconductor package of claim 13, further comprising a second functional block comprising a stack of memory chips disposed on the single first chip and the block of silicon-containing material, the stack of memory chips having a footprint on the electronic package substrate that spans the first and second regions of the electronic package substrate.

15. The semiconductor package of claim 11, wherein the second chip is flip-chip bonded to the electronic package substrate.

16. A semiconductor package, comprising:
    an electronic package substrate;
    a first functional block comprising at least one first chip disposed on an upper surface of and electrically connected to the electronic package substrate, the first functional block having a footprint on a first region of an upper surface of the electronic package substrate;
    a second chip disposed on the upper surface of and electrically connected to the electronic package substrate, the second chip being disposed beside the at least one first chip as viewed in a plan view such that the second chip has a footprint on a second region of the electronic package substrate beside the first region;
    a silicon-based third chip disposed on the second chip and disposed beside the at least one first chip as viewed in a plan view; and
    a molded layer on the electronic package substrate and in which the first functional block, the second chip and the silicon-based third chip are encapsulated,
    wherein a width of the silicon-based third chip, in a direction parallel to an upper surface of the electronic package substrate, is equal to or greater than a width of the second chip in said direction such that the silicon-based third chip has a footprint on the second region of the electronic package substrate, and the silicon-based third chip has a silicon content ratio greater than that of the molded layer.

17. The semiconductor package of claim 16, wherein the second chip is flip-chip bonded to the electronic package substrate, and the silicon-based third chip is wire-bonded to the electronic package substrate.

18. The semiconductor package of claim 16, wherein the second chip is flip-chip bonded to the electronic package substrate, and the silicon-based third chip is a dummy chip electrically isolated from the electronic package substrate, the first functional block, and the second chip.

19. The semiconductor package of claim 16, wherein the at least one first chip is a memory chip stack, and a top surface of the silicon-based chip and a top surface an uppermost memory chip of the memory chip stack are situated at substantially the same distance above the upper surface of the electronic package substrate.

* * * * *